(12) United States Patent
Zhao et al.

(10) Patent No.: US 11,854,607 B2
(45) Date of Patent: Dec. 26, 2023

(54) MEMORY STRUCTURE AND MEMORY LAYOUT

(71) Applicant: CHANGXIN MEMORY TECHNOLOGIES, INC., Hefei (CN)

(72) Inventors: Yang Zhao, Hefei (CN); Jaeyong Cha, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 111 days.

(21) Appl. No.: 17/661,326

(22) Filed: Apr. 29, 2022

(65) Prior Publication Data

US 2022/0383936 A1 Dec. 1, 2022

(30) Foreign Application Priority Data

May 31, 2021 (CN) .......................... 202110601636.1

(51) Int. Cl.
*G11C 7/10* (2006.01)
*G11C 11/4091* (2006.01)
*G11C 11/4096* (2006.01)

(52) U.S. Cl.
CPC ...... *G11C 11/4091* (2013.01); *G11C 11/4096* (2013.01)

(58) Field of Classification Search
CPC .................. G11C 11/4091; G11C 11/4096
See application file for complete search history.

(56) References Cited

U.S. PATENT DOCUMENTS

| | | | | |
|---|---|---|---|---|
| 5,793,686 A * | 8/1998 | Furutani | ................ | G11C 29/38 365/201 |
| 6,495,870 B1 * | 12/2002 | Sekiguchi | .............. | H10B 12/48 257/E27.081 |
| 7,009,880 B1 * | 3/2006 | Liu | ........................ | G11C 16/26 365/185.11 |
| 9,053,963 B2 | 6/2015 | Lee et al. | | |
| 10,607,690 B2 | 3/2020 | Cole et al. | | |
| 2005/0030831 A1 * | 2/2005 | Terzioglu | ............. | G11C 29/785 365/232 |
| 2010/0103749 A1 * | 4/2010 | Hosoe | .................... | G11C 5/025 365/189.05 |
| 2022/0384451 A1 * | 12/2022 | Zhao | .................... | G11C 11/4096 |

FOREIGN PATENT DOCUMENTS

CN    110875065 A    3/2020

* cited by examiner

*Primary Examiner* — Min Huang

(74) *Attorney, Agent, or Firm* — Cooper Legal Group, LLC

(57) ABSTRACT

Embodiments of the present application provide a memory structure and a memory layout. The memory structure includes: memory arrays, each including a plurality of memory cells; read-write conversion circuits, each disposed between two adjacent ones of the memory arrays in a first direction, being arranged in a second direction, having a symmetry axis in the second direction, and configured to write external data into the memory cells, or read data from the memory cells, and the first direction being perpendicular to the second direction; sense amplification circuits, symmetrically disposed between two adjacent ones of the memory arrays based on the symmetry axis, coupled to the memory cells in the adjacent ones of the memory arrays; and bias contact point structures, disposed in gaps between the read-write conversion circuits, and configured to set a bias voltage of a well region where the bias contact point structures are located.

24 Claims, 5 Drawing Sheets

MEMORY STRUCTURE AND MEMORY LAYOUT

CROSS-REFERENCE TO RELATED APPLICATIONS

This application claims the priority of Chinese Patent Application No. 202110601636.1, submitted to the Chinese Intellectual Property Office on May 31, 2021, the disclosure of which is incorporated herein in its entirety by reference.

TECHNICAL FIELD

The present application relates to the field of semiconductor memory structure design, in particular to a memory structure and a memory layout.

BACKGROUND

In a dynamic random access memory (DRAM), an operation of writing data into the memory is accomplished by storing charge into a capacitor of a memory cell, and an operation of reading data from the memory is accomplished by reading charge in the capacitor of the memory cell.

In the DRAM, the memory cell is connected to a bit line (BL) and a complementary bit line (BLB). During the data readout operation, a sense amplifier in the readout circuit is configured to read a voltage of the BL and a voltage of the BLB, and amplify a voltage difference between the bit line BL and the complementary bit line BLB.

However, the applicant found that in the related art, bias voltage supply points are located on two sides of read-write conversion circuits. Distances between adjacent bias voltage supply points are large. For metal-oxide-silicon (MOS) transistors in different sense amplifiers disposed between the memory cells, a MOS transistor disposed in a middle region has a relatively large distance to the bias voltage supply points, which results in a relatively large error of a bulk bias voltage of the MOS transistor in the middle region as compared to a bulk bias voltage of a MOS transistor in an edge region, thereby affecting an overall amplification capability of the sense amplifiers. In addition, the read-write conversion circuits at different positions may have different bulk bias voltages, thereby reducing performance of the DRAM.

SUMMARY

An embodiment of the present application provides a memory structure, including: memory arrays, each including a plurality of memory cells; read-write conversion circuits, each disposed between two adjacent ones of the memory arrays in a first direction, the read-write conversion circuits being arranged in a second direction, having a symmetry axis in the second direction, and configured to write external data into the memory cells, or read data from the memory cells, and the first direction being perpendicular to the second direction; sense amplification circuits, symmetrically disposed between two adjacent ones of the memory arrays based on the symmetry axis, coupled to the memory cells in the adjacent ones of the memory arrays, and configured to sense voltages of the memory cells and output logic 1 or 0 corresponding to the voltages of the memory cells; and bias contact point structures, disposed in gaps between the read-write conversion circuits, and configured to set a bias voltage of a well region where the bias contact point structures are located. In the first direction, the sense amplification circuits adjacent to the bias contact point structures are at an equal distance away from the read-write conversion circuits and the bias contact point structures.

An embodiment of the present application further provides a memory layout, including: memory array layouts; read-write conversion circuit layouts, disposed between two adjacent ones of the memory array layouts in a first direction, the read-write conversion circuit layouts being arranged in a second direction, having a symmetry axis in the second direction, and the first direction being perpendicular to the second direction; sense amplification circuit layouts, symmetrically disposed between two adjacent ones of the memory arrays based on the symmetry axis; and bias contact point structure layouts, disposed in gaps between the read-write conversion circuit layouts; where in the first direction, the sense amplification circuit layouts adjacent to the bias contact point structure layouts are at an equal distance away from the read-write conversion circuit layouts and the bias contact point structure layouts.

DETAILED DESCRIPTION

Figure 1:
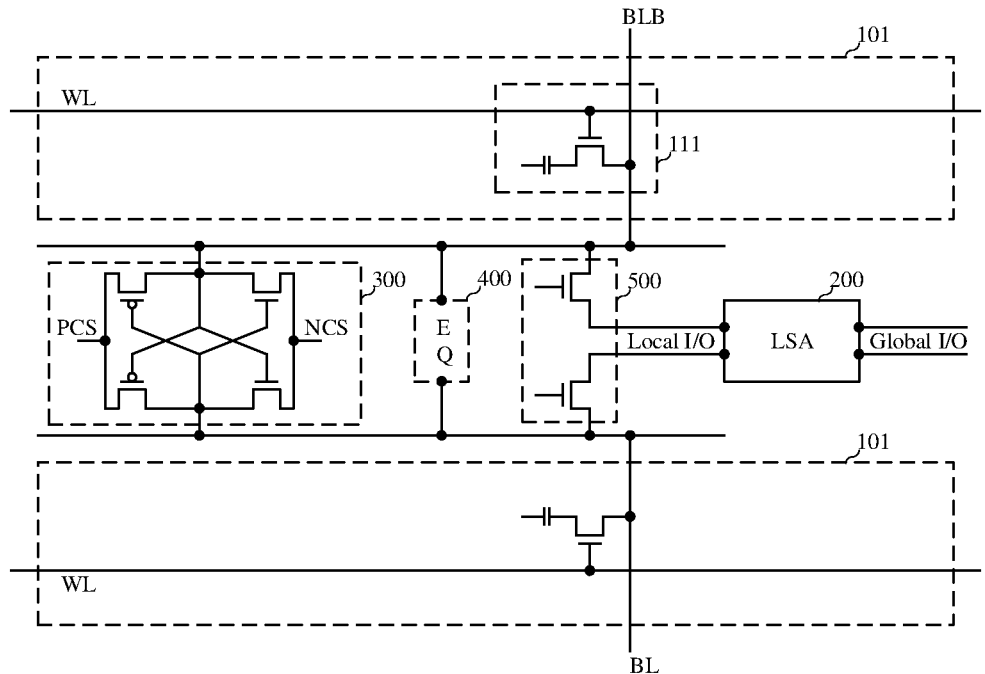
FIG. 1 is a schematic structural diagram of a memory.

Referring to FIG. 1, in a memory structure, each memory array 101 includes a plurality of memory cells 111. A memory cell 111 is a one-transistor-one-capacitor (1T1C) structure constituted by a cell transistor and a cell capacitor. A read-write conversion circuit 200, a sense amplification circuit 300, an equalization circuit 400, and an input/output circuit 500 are disposed between adjacent memory arrays.

One terminal of a source and a drain of the cell transistor is connected to the cell capacitor, and the other terminal is connected to a bit line BL/complementary bit line BLB. A word line WL is connected to a gate of the cell transistor, and is configured to selectively turn on the gate of the corresponding cell transistor, so as to connect the cell capacitor with the bit line BL/complementary bit line BLB. In this way, an electrical signal in the bit line BL/the complementary bit line BLB is written into the cell capacitor, or an electrical signal in the cell capacitor is read to the bit line BL/complementary bit line BLB.

The equalization circuit 400 is connected to the bit line BL and the complementary bit line BLB, and is configured to equalize voltages of the bit line BL and the complementary bit line BLB in a pre-charge stage.

The input/output circuit 500 includes: an input/output transistor. One terminal of a source and a drain of the input/output transistor is connected to the bit line BL/complementary bit line BLB, and the other terminal is connected to a local data line Local I/O. A gate is configured to receive a selection signal, and, according to the selection signal, selectively turn on the bit line BL/complementary bit line BLB corresponding to the selection signal, so as to connect the bit line BL/complementary bit line BLB with the local data line Local I/O, thereby realizing data transfer between the bit line BL/complementary bit line BLB and the local data line Local I/O.

The local data line Local I/O is connected to a global data line Global I/O via the read-write conversion circuit 200, so as to transmit external data or data in the local sense amplifier (disposed in the read-write conversion circuit 200) to the local data line Local I/O, or output data in the local data line Local I/O to the global data line Global I/O.

The sense amplification circuit 300 is connected between the bit line BL and the complementary bit line BLB. In a case that the electrical signal in the cell capacitor is read to the bit line BL/complementary bit line BLB, the voltage of the bit line BL/complementary bit line BLB is increased or decreased by a voltage variation $\Delta V$ from a pre-charge voltage, due to charge sharing between the cell capacitor and the bit line BL/complementary bit line BLB. The sense amplification circuit 300 is configured to response to readout of a first control signal PCS and a second control signal NCS, and amplify the voltage variation $\Delta V$ between the bit line BL and the complementary bit line BLB.

Bias voltage supply points are located on opposite sides of the read-write conversion circuits 200 along a length direction. Distances between adjacent bias voltage supply points are large. For MOS transistors in different sense amplifiers disposed between the memory cells 111, a MOS transistor disposed in a middle region has a relatively large distance to the bias voltage supply points, which results in a relatively large error of a bulk bias voltage of the MOS transistor in the middle region as compared to a bulk bias voltage of a MOS transistor in an edge region, thereby affecting an overall amplification capability of the sense amplifiers. In addition, the read-write conversion circuits at different positions may require different bias voltages, thereby reducing performance of the DRAM.

In order to solve the above technical problem, the embodiments of the present application provide a memory structure and a memory layout, including: memory arrays, each including a plurality of memory cells; read-write conversion circuits, disposed between two adjacent ones of the memory arrays in a first direction, the read-write conversion circuits being arranged in a second direction, having a symmetry axis in the second direction, and configured to write external data into the memory cells, or read data from the memory cells, and the first direction being perpendicular to the second direction; sense amplification circuits, symmetrically disposed between two adjacent ones of the memory arrays based on the symmetry axis, coupled to the memory cells in the adjacent ones of the memory arrays, and configured to sense voltages of the memory cells and output logic 1 or 0 corresponding to the voltages of the memory cells; and bias contact point structures, disposed in gaps between the read-write conversion circuits, and configured to set a bias voltage of a well region where the bias contact point structures are located. In the first direction, the sense amplification circuits adjacent to the bias contact point structures are at an equal distance away from the read-write conversion circuits and the bias contact point structures.

In order to make the objectives, technical solutions and advantages of the embodiments of the present application clearer, the embodiments of the present application are described below with reference to the accompanying drawings. Those of ordinary skill in the art should understand that many technical details are proposed in each embodiment of the present application to help the reader better understand the present application. However, even without these technical details and various changes and modifications made based on the following embodiments, the technical solutions claimed in the present application may still be realized. The following divisions of the various embodiments are intended for convenience of description, and are not intended to constitute any limitation to the specific implementation of the present application. The various embodiments may be combined with each other in case of no contradiction.

Figure 2:
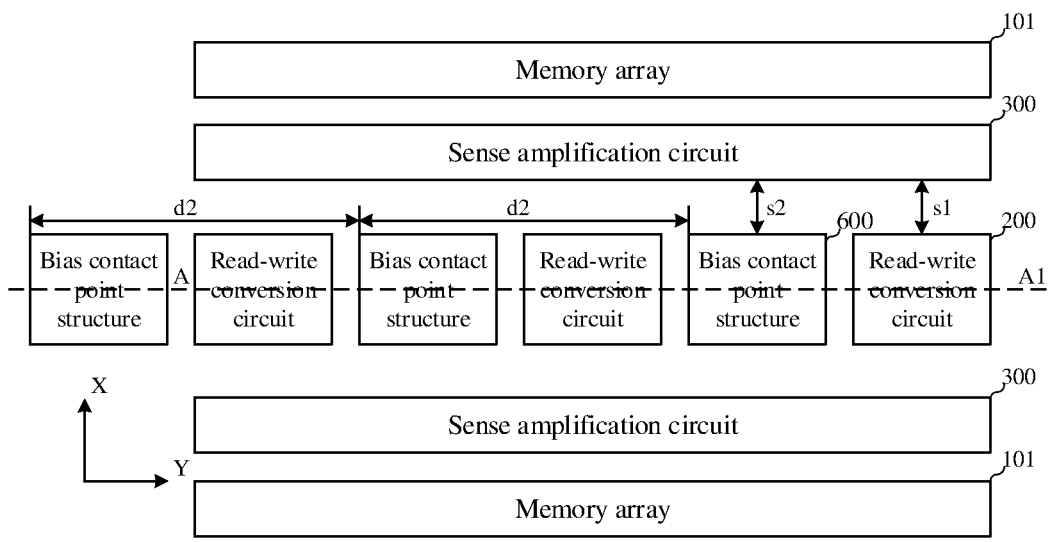
FIG. 2 is a schematic structural diagram of a memory structure according to an embodiment of the present application.
Figure 3:
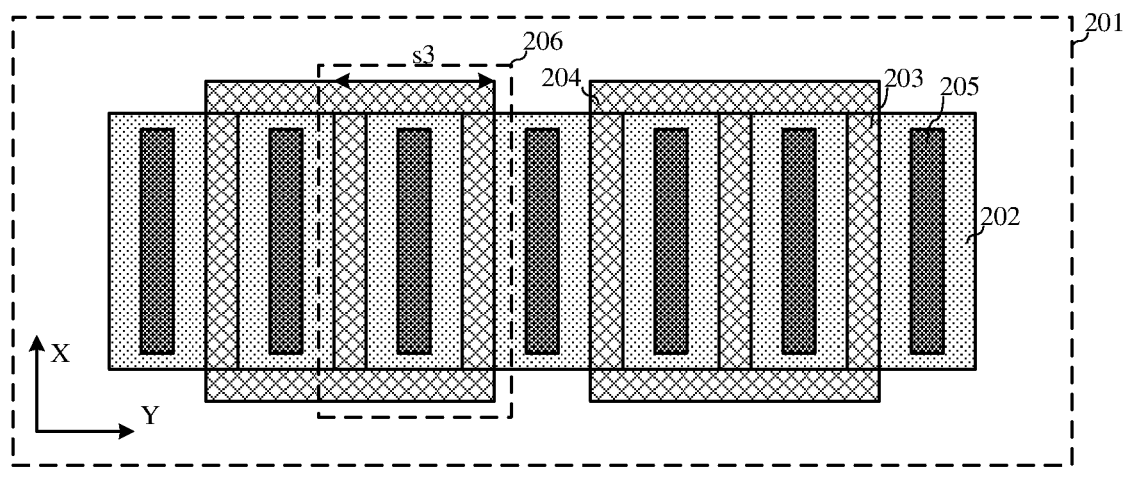
FIG. 3 is a schematic structural diagram of a read-write conversion circuit according to an embodiment of the present application.
Figure 4:
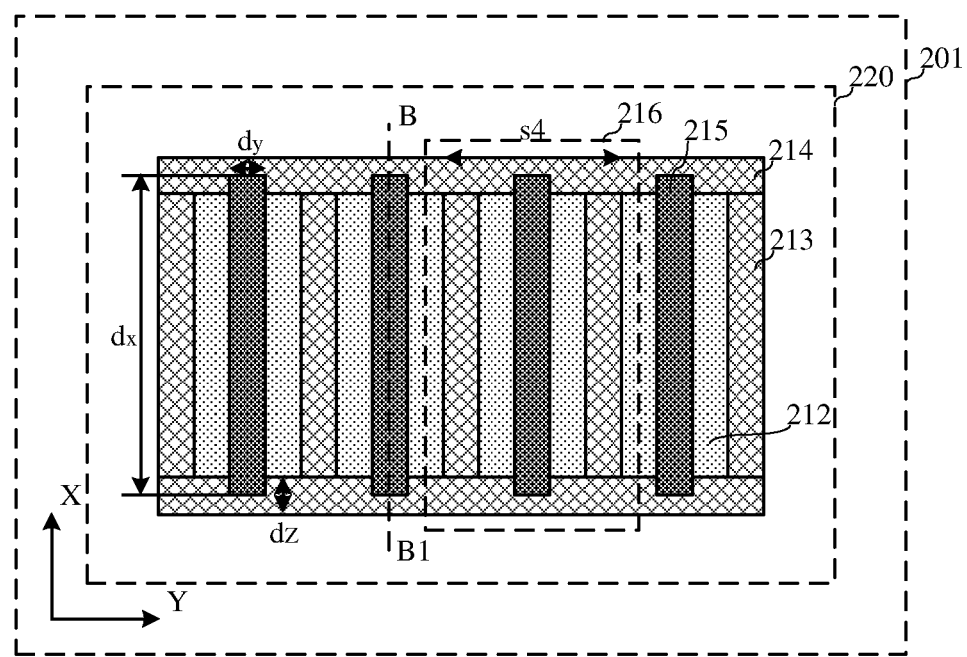
FIG. 4 is a schematic structural diagram of a bias contact point structure according to an embodiment of the present application.
Figure 5:
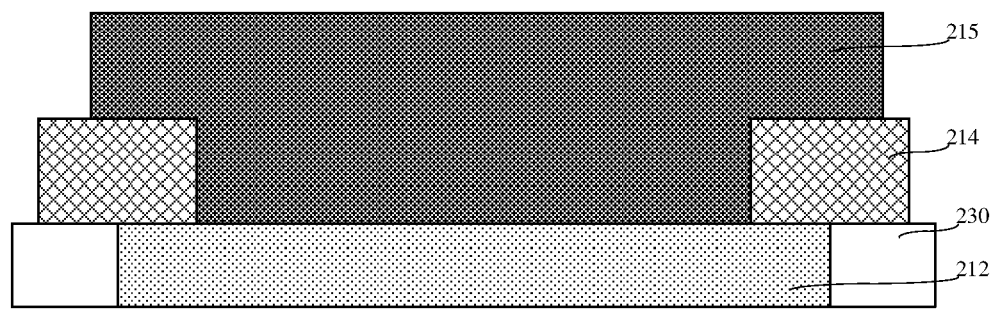
FIG. 5 is a schematic cross-sectional structural diagram of a bias contact point structure according to an embodiment of the present application.
Figure 6:
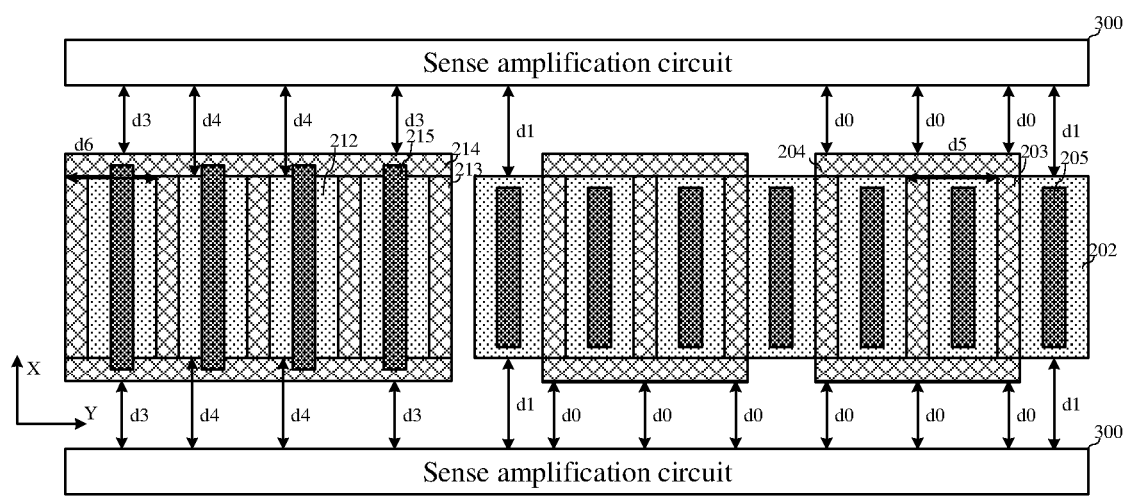
FIG. 6 is a schematic structural diagram of a combination of a read-write conversion circuit and a bias contact point structure according to an embodiment of the present application.
Figure 7:
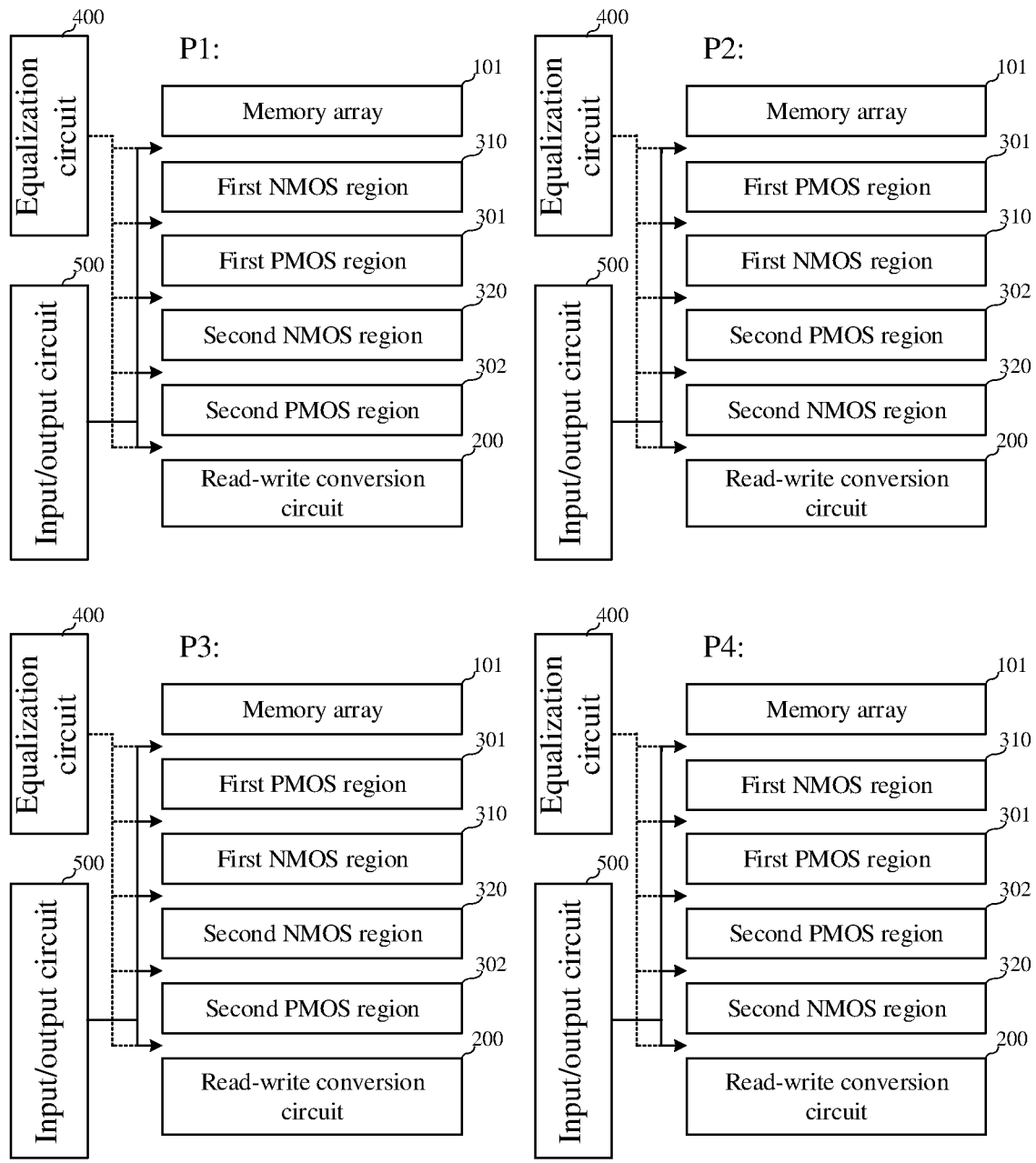
FIG. 7 is a schematic diagram of a layout manner of a memory structure according to an embodiment of the present application.

FIG. 2 is a schematic structural diagram of a memory structure according to this embodiment of the present application. FIG. 3 is a schematic structural diagram of a read-write conversion circuit according to this embodiment of the present application. FIG. 4 is a schematic structural diagram of a bias contact point structure according to this embodiment of the present application. FIG. 5 is a schematic cross-sectional structural diagram of a bias contact point structure according to this embodiment of the present application. FIG. 6 is a schematic structural diagram of a combination of a read-write conversion circuit and a bias contact point structure according to this embodiment of the present application. FIG. 7 is a schematic diagram of a layout manner of a memory structure according to this embodiment of the present application. The following details the memory structure according to this embodiment with reference to the accompanying drawings, specifically as follows:

Referring to FIG. 2, the memory structure includes:

Memory arrays 101, each memory array 101 including a plurality of memory cells 111 (referring to FIG. 1).

Read-write conversion circuits 200, disposed between two adjacent ones of the memory arrays 101 in a first direction X. The read-write conversion circuits 200 are arranged in a second direction Y, and have a symmetry axis AA1 in the second direction. The read-write conversion circuits 200 are configured to write external data into the memory cells 111 (referring to FIG. 1), or read data of the memory cells 111. The first direction X and the second direction Y are perpendicular to each other. It should be noted that, the "external data" in this embodiment includes, but is not limited to, data in the global data line Global I/O (referring to FIG. 1) and in a local sense amplifier (referring to FIG. 1, disposed in the read-write conversion circuit 200).

Sense amplification circuits 300, symmetrically disposed between two adjacent ones of the memory arrays 101 based on the symmetry axis AA1, coupled to the memory cells 111 (referring to FIG. 1) in the adjacent ones of the memory arrays 101, and configured to sense voltages of the memory cells 111 (referring to FIG. 1) and output logic 1 or 0 corresponding to the memory cells 111 (referring to FIG. 1).

It should be noted that, in a gap between adjacent memory arrays 101, the read-write conversion circuits 200 and the sense amplification circuits 300 are arranged in the second direction Y. That is, a plurality of read-write conversion circuits 200 and sense amplification circuits 300 are arranged in the second direction Y.

Bias contact point structures 600, disposed in gaps between the read-write conversion circuits 200, and configured to set a bias voltage of a well region where the bias contact point structures 600 are located. By arranging the bias contact point structures 600 in the gaps between the read-write conversion circuits 200, distances between the bias contact point structures 600 and the MOS transistors in different sense amplification circuits 300 are reduced, which avoids a deviation of a bulk bias voltage of a MOS transistor in a middle region of the sense amplification circuit structure compared with a bulk bias voltage of a MOS transistor in an edge region, thereby balancing the bulk bias voltages of the MOS transistors in the different sense amplifiers between the memory arrays 101. The substrate bias is provided by the bias contact point structures 600 at different positions, to reduce a bulk resistance of the substrate of the MOS transistors, thereby reducing a latch-up of the MOS transistors.

It should be noted that, in this embodiment, the MOS transistors in the read-write conversion circuits 200 are all N-channel metal-oxide semiconductor (NMOS) structures. The NMOS transistors in the bias contact point structures 600, the read-write conversion circuits 200 and the sense amplification circuits 300 are disposed in the same well region. In other embodiments, the MOS transistors in the read-write conversion circuits may be P-channel metal-oxide semiconductor (PMOS) structures. Correspondingly, the PMOS transistors in the bias contact point structures, the read-write conversion circuits and the sense amplification circuits are disposed in the same well region.

In the first direction X, distances s1 between the sense amplification circuits 300 adjacent to the bias contact point structures 600 and the read-write conversion circuits 200 are equal to distances s2 between the sense amplification circuits 300 and the bias contact point structures 600. By setting s1=s2, it is ensured that environments of the MOS transistors in the different sense amplification circuits 300 on two sides of the read-write conversion circuits 200 are consistent with one another. This balances the device characteristics of the MOS transistors in the different sense amplifiers, thereby improving the stability of the DRAM.

In this embodiment, in the second direction Y, distances d2 between adjacent bias contact point structures 600 are equal. In other embodiments, the distances between bias contact point structures may also be determined according to the structures of the MOS transistors in the sense amplification circuits.

In this embodiment, as an example, the MOS transistors in the read-write conversion circuits 200 are NMOS transistors, which, however, does not constitute a limitation on this embodiment. In other embodiments, the MOS transistors in the read-write conversion circuits may be PMOS transistors.

In some embodiments, referring to FIG. 3, each of the MOS transistors in the read-write conversion circuits 200 includes:

A first active area 202, disposed in a well region 201 of a semiconductor substrate, and extending in the second direction Y.

Gate structures 203, disposed on the first active area 202 at intervals, and extending in the first direction X. Extension directions of the gate structures 203 are the same as extension directions of gate structures of MOS transistors in the sense amplification circuits 300.

The gate structures 203 of the read-write conversion circuits 200 extend in the first direction, and the read-write conversion circuits 200 have a symmetry axis AA1 in the second direction Y. The extension directions of the gate structures 203 of the MOS transistors in the read-write conversion circuits 200 are consistent with the extension directions of the gate structures of the MOS transistors in the sense amplification circuits 300, which further ensures that the distances between the gate structures of the corresponding MOS transistors in the sense amplification circuits 300 on two sides of the read-write conversion circuits 200 and the gate structures 203 of the MOS transistors in the read-write conversion circuits 200 are equal. This balances the device characteristics of the sense amplifiers on two sides of the read-write conversion circuits 200, thereby improving the stability of the DRAM.

Gate extension structures 204, disposed on edges of the gate structures 203 on the first active area 202, and extending in the second direction Y. The gate extension structures 204 and the gate structures 203 form ring-shaped gate structures 206. In the first direction X, distances d0 (referring to FIG. 6) between the gate structures of the MOS transistors in the sense amplification circuits 300 adjacent to the gate extension structures 204 and the gate extension structures 204 are equal. By forming the gate extension structures 204 at the edges of the gate structures 203, the gate extension structures 204 and the gate structures 203 form the ring-shaped gate structures 206. The gate extension structures 204 extend in the second direction Y. That is, the gate extension structures 204 are disposed in parallel with the adjacent sense amplification circuits 300, to ensure that the distances between the gate structures of the MOS transistors in any adjacent sense amplification circuits 300 and the gate extension structures 204 are equal.

In this embodiment, the gate extension structures 204 and the gate structures 203 are made of a same material. Heights of top surfaces of the gate extension structures 204 are consistent with heights of top surfaces of the gate structures 203. Thicknesses of the gate extension structures 204 are consistent with thicknesses of the gate structures 203. By ensuring that the gate extension structures 204 and the gate structures 203 have the same material, thicknesses and heights, the gate extension structures 204 and the gate structures 203 may be formed in the same process step.

Conductive contact structures 205, disposed on the first active area 202 in gaps between two adjacent ones of the gate structures 203. Heights of top surfaces of the conductive contact structures 205 are higher than the heights of the top surfaces of the gate structures 203. The first active area 202 on two sides of the gate structures 203 are respectively used as sources and drains of the MOS transistors. One ends of the conductive contact structures 205 are electrically connected to the first active area 202 on two sides of the gate structures 203, and the other ends are configured to export signals of the first active area 202.

In this embodiment, the conductive contact structures 205 and the gate extension structures 204 are insulated from each other.

In an example, the conductive contact structures 205 extend in the first direction X, and are in no contact with the ring-shaped gate structures 206. By separately arranging the conductive contact structures 205 and the ring-shaped gate structures 206, the conductive contact structures 205 and the gate extension structures 204 are insulated from each other.

In another example, the read-write conversion circuit 200 further includes: isolation structures, disposed on inner sidewalls of the ring-shaped gate structures 206. The conductive contact structures 205 fill remaining voids of the ring-shaped gate structures 206, so that the conductive contact structures 205 and the gate extension structures 204 are insulated from each other by the isolation structures.

In some embodiments, referring to FIG. 4 and FIG. 5, FIG. 5 is a schematic cross-sectional diagram along a direction BB1 in FIG. 4. The bias contact point structure 600 includes:

A doping region 220, disposed in the well region 201. An ion type doped in the doping region 220 is the same as an ion type doped in the well region 201, and an ion concentration doped in the doping region 220 is greater than an ion concentration doped in the well region 201.

A second active area 212, disposed in the doping region 220.

An isolation region 230 (referring to FIG. 5), disposed on an edge of the second active area 212 in a surrounding way.

First equalization structures 213, disposed on the second active area 212 at intervals, and lengths of the first equalization structures 213 in the second direction Y being smaller than lengths of the first equalization structures 213 in the first direction X.

Second equalization structure 214, disposed on the second active area 212 and the isolation region 230 (referring to FIG. 5), extending in the second direction Y, and located at edges of the first equalization structures 213. The second equalization structures 214 and the first equalization structures 213 form ring-shaped equalization structures 216.

In this embodiment, in the first direction X, a length s4 (referring to FIG. 4) of an outer side of each ring-shaped equalization structure 216 is the same as a length s3 (referring to FIG. 3) of an outer side of each ring-shaped gate structure 206.

In an example, a length of each first equalization structure 213 in the first direction X is dx, a length dz of each second equalization structure 214 in the first direction X is the same as a length dy of each first equalization structure 213 in the second direction Y, and dx is greater than dy.

In an example, the first equalization structures 213 and the second equalization structures 214 are made of a same material. Heights of top surfaces of the first equalization structures 213 are consistent with heights of top surfaces of the second equalization structures 214. Thicknesses of the first equalization structures 213 are consistent with thicknesses of the second equalization structures 214. By ensuring that the first equalization structures 213 and the second equalization structures 214 have the same material, thickness, and height, the first equalization structures 213 and the second equalization structures 214 may be processed in the same process step.

Further, in an example, the first equalization structures 213, the second equalization structures 214, and the gate structures 203 are made of a same material. By ensuring that the first equalization structures 213, the second equalization structures 214 and the gate structures 203 are made of the same material, the ring-shaped gate structures 206 and the ring-shaped equalization structures 216 may be formed in the same process step.

Bias contact structures 215, disposed on the second active area 212 in the gaps between two adjacent ones of the first equalization structures 213. Heights of top surfaces of the bias contact structures 215 are higher than heights of top surfaces of the first equalization structures 213.

In some embodiments, in the first direction X, lengths of the bias contact structures 215 are greater than lengths of the first equalization structures 213. In addition, the bias contact structures 215 are also partially located on top surfaces of the second equalization structures 214, and are in connect with the second equalization structures. The bias contact structures 215 are in contact with the second equalization structures 214. That is, the bias contact structures 215 are also indirectly in contact with the first equalization structures 213. That is, the bias contact structures 215 are also configured to balance voltages of the ring-shaped equalization structures 216, to avoid the ring-shaped equalization structures 216 from being in a floating state.

In an example, the bias contact structures 215 and the conductive contact structures 205 are made of a same material, so that the bias contact structures 215 and the conductive contact structures 205 may be formed in the same process step.

Referring to FIG. 6, the extension directions of the gate structures of the MOS transistors in the sense amplification circuits 300 are the same as the extension directions of the gate structures of the MOS transistors in the read-write conversion circuits 200. The sense amplification circuits 300 are disposed based on the symmetry axis AA1 of the read-write conversion circuits 200. That is, the MOS transistors in the different sense amplification circuits 300 are disposed based on the symmetry axis AA1 of the read-write conversion circuits 200, to ensure that the environments of the corresponding MOS transistors in the sense amplification circuits 300 on two sides of the read-write conversion circuits 200 are consistent. It should be noted that, in this embodiment, the "environment" consistency refers to that surrounding semiconductor structures made of the same material have the same characteristics in terms of size, distance, and layout.

For each of the MOS transistors in the read-write conversion circuits 200, in the first direction X, the active areas of the MOS transistors in the sense amplification circuits 300 adjacent to the MOS transistors in the read-write conversion circuit 200 are at an equal distance away from the first active area 202.

In some embodiments, the first active area 202 is at a distance of d1 to the active area in the sense amplification circuit 300 on either side. In addition, any edge position of the first active area 202 has an equal distance to the active area in the sense amplification circuit 300 on either side. Distances between the gate extension structures 204 and the gate structures in the sense amplification circuits 300 on two sides are d0, and any edge position of the gate extension structures 204 has an equal distance to the gate structures in the sense amplification circuits 300 on two sides, to ensure that the environments of the gate structures of the different MOS transistors in the sense amplification circuits on two sides of the read-write conversion circuits 200 are consistent. In addition, intervals d5 between adjacent gate structures that are disposed at intervals are the same.

For each of the bias contact point structures 600, in the first direction X, distances between the active areas of the MOS transistors in the sense amplification circuits 300 adjacent to the bias contact point structure 600 and the second active area 212 are equal.

In some embodiments, the second active area 212 is at a distance of d4 to the active areas in the sense amplification circuits 300 on two sides. In addition, any edge position of the second active area 212 has an equal distance to the active areas in the sense amplification circuits 300 on two sides.

Further, the distances d1 between the active areas in the sense amplification circuits 300 adjacent to one of the bias contact point structures 600 and the first active area 202 are equal to the distances d4 between the active areas in the sense amplification circuits 300 adjacent to the bias contact point structure 600 and the second active area 212, i.e., d1=d4. By ensuring that the distances d4 between the active areas in the adjacent sense amplification circuits and the second active area 212 are equal to the distances d1 between the active areas in the adjacent sense amplification circuits and the first active area 202, it is ensured that the bias contact point structures 600 disposed in the gaps between the read-write conversion circuits 200 do not change the environments of the active areas in the sense amplification circuits 300.

Distances between the second equalization structures 214 and the gate structures in the sense amplification circuits 300 on two sides are d3, and any edge position of the second equalization structures 214 has an equal distance to the gate structures in the sense amplification circuits 300 on two sides, to ensure that the environments of the gate structures of the different MOS transistors in the sense amplification circuits 300 on two sides of the bias contact point structures 600 are consistent. In addition, intervals d6 between adjacent first equalization structures 213 that are disposed at intervals are the same.

Further, the distances d0 between the gate structures in the sense amplification circuits 300 adjacent to the bias contact point structures 600 and the gate extension structures 204 are equal to the distances d3 between the gate structures in the sense amplification circuits 300 adjacent to the bias contact point structures 600 and the second equalization structures 214, namely d0=d3. By ensuring that the gate structures in the adjacent sense amplification circuits 300 are at an equal distance away from the gate extension structures 204 and the second equalization structures 214, it is ensured that the bias contact point structures 600 disposed in the gaps between the read-write conversion circuits 200 do not change the environments of the gate structures in the sense amplification circuits 300.

Referring to FIG. 7, in this embodiment, the sense amplification circuit 300 includes:

a circuit of a first NMOS region 310, coupled to the memory cells 111 (referring to FIG. 1) in the adjacent memory array 101; a circuit of a second NMOS region 320, coupled to the memory cells 111 in the adjacent memory array 101 (referring to FIG. 1); a circuit of a first PMOS region 301, coupled to the memory cells 111 in the adjacent memory array 101 (referring to FIG. 1); and a circuit of a second PMOS region 302, coupled to the memory cells 111 in the adjacent memory array 101 (referring to FIG. 1). The circuits of the first NMOS regions 310 in the sense amplification circuits 300 on two sides of the read-write conversion circuits 200 are symmetrically disposed based on the symmetry axis AA1; the circuits of the second NMOS regions 320 in the sense amplification circuits 300 on two sides of the read-write conversion circuits 200 are symmetrically disposed based on the symmetry axis AA1; the circuits of the first PMOS regions 301 in the sense amplification circuits 300 on two sides of the read-write conversion circuits 200 are symmetrically disposed based on the symmetry axis AA1; and the circuits of the second PMOS regions 302 in the sense amplification circuits 300 on two sides of the read-write conversion circuits 200 are symmetrically disposed based on the symmetry axis AA1.

Referring to FIG. 7, the sense amplification circuits 300 further include: equalization circuits 400, symmetrically disposed between two adjacent ones of the memory arrays 101 based on the symmetry axis AA1, and electrically connected to the sense amplification circuits 300, for balancing voltages of lines, wherein each of the lines is between one sense amplification circuit 300 and one the memory cell 111 coupled to the sense amplification circuit 300 (referring to FIG. 1); and input/output circuits 500, symmetrically disposed between two adjacent ones of the memory arrays 101 based on the symmetry axis AA1, and electrically connected to the memory cells 111 of the adjacent ones of the memory arrays 101, for selecting the memory cells 111 in the memory arrays 101. In a case of performing a write operation, the memory transmits the data on the local data line Local I/O to the bit line BL, and then writes the data into the memory cells 111; in a case of performing a read operation, the memory transfers the data on the bit line BL to the local data line Local I/O, thereby reading out the data from the memory.

In a case of lay outing the sense amplification circuits 300, the equalization circuits 400, the input/output circuits 500, and the read-write conversion circuits 200, the read-write conversion circuits 200 are disposed in a middle portion of the gap between two adjacent ones of the memory arrays 101, and the read-write conversion circuits 200 have the symmetry axis AA1. The circuits of the first NMOS regions 310, the circuits of the second NMOS regions 320, the circuits of the first PMOS regions 301, the circuits of the second PMOS regions 302, the equalization circuits 400, and the input/output circuits 500 are symmetrically disposed on two sides of the read-write conversion circuits 200 based on the symmetry axis AA1, respectively.

In some embodiments, in a layout manner, referring to the layout manners shown as P1 and P2 in FIG. 7, a circuit of the first NMOS region 310, a circuit of the second NMOS region 320, a circuit of the first PMOS region 301 and a circuit of the second PMOS region 302 are alternately arranged on one side of the read-write conversion circuits 200. An equalization circuit 400 and an input/output circuit 500 may be located at any position between the circuit of the first NMOS region 310, the circuit of the second NMOS region 320, the circuit of the first PMOS region 301 and the circuit of the second PMOS region 302. The equalization circuit 400 disposed on the same side is served as the equalization circuit 400 for one sense amplification circuit 300 (referring to FIG. 1).

In a layout manner, referring to the layout manners shown as P3 and P4 in FIG. 7, the circuit of the first NMOS region 310 and the circuit of the second NMOS region 320 are located between the circuit of the first PMOS region 301 and the circuit of the second PMOS region 302, or the circuit of the first PMOS region 301 and the circuit of the second PMOS region 302 are located between the circuit of the first NMOS region 310 and the circuit of the second NMOS region 320. An equalization circuit 400 and an input/output circuit 500 may be located at any position between the circuit of the first NMOS region 310, the circuit of the second NMOS region 320, the circuit of the first PMOS region 301 and the circuit of the second PMOS region 302. The equalization circuit 400 on the same side is served as the equalization circuit 400 for one sense amplification circuit 300 (referring to FIG. 1).

It should be noted that, the layout manners shown in FIG. 7 merely illustrate exemplary manners of the sense amplification circuit 300 on one side of the read-write conversion circuits 200. The sense amplification circuit on the other side of the read-write conversion circuits 200 is arranged symmetrically with respect to the shown sense amplification circuit 300 based on the symmetry axis AA1.

Compared with the related art, the bias contact point structures are disposed in the gaps between the read-write conversion circuits, to reduce the distances between the bias contact point structures and the MOS transistors in the different sense amplification circuits, which avoids a deviation of a bulk bias voltage of a MOS transistor in the middle region of the sense amplification circuit structure compared with a bulk bias voltage of a MOS transistor in an edge region, thereby balancing the bulk bias voltages of the MOS transistors in the different sense amplifiers between the memory arrays. The substrate bias is provided by the bias contact point structures at different positions, to reduce a bulk resistance of the substrate of the MOS transistors, thereby reducing a latch-up of the MOS transistors. In addition, the sense amplification circuits adjacent to the bias contact point structures are at an equal distance away from the read-write conversion circuits and the bias contact point structures, to ensure that the environments of the corresponding MOS transistors in the different sense amplification circuits on two sides of the read-write conversion circuits, which balances the device characteristics of the MOS transistors in the different sense amplifiers, thereby improving the stability of the DRAM.

Another embodiment of the present application also provides a memory layout, including: a memory array layout; read-write conversion circuit layouts, disposed between two adjacent ones of the memory array layouts in a first direction, and the read-write conversion circuit layouts being arranged in a second direction, and having a symmetry axis in the second direction, the first direction being perpendicular to the second direction; sense amplification circuit layouts, symmetrically disposed between two adjacent ones of the memory array layouts based on the symmetry axis; and bias contact point structure layouts, disposed in gaps between the read-write conversion circuit layouts. In the first direction, the sense amplification circuit layouts adjacent to the bias contact point structure layouts are at an equal distance away from the read-write conversion circuit layouts and the bias contact point structure layouts.

Figure 8:
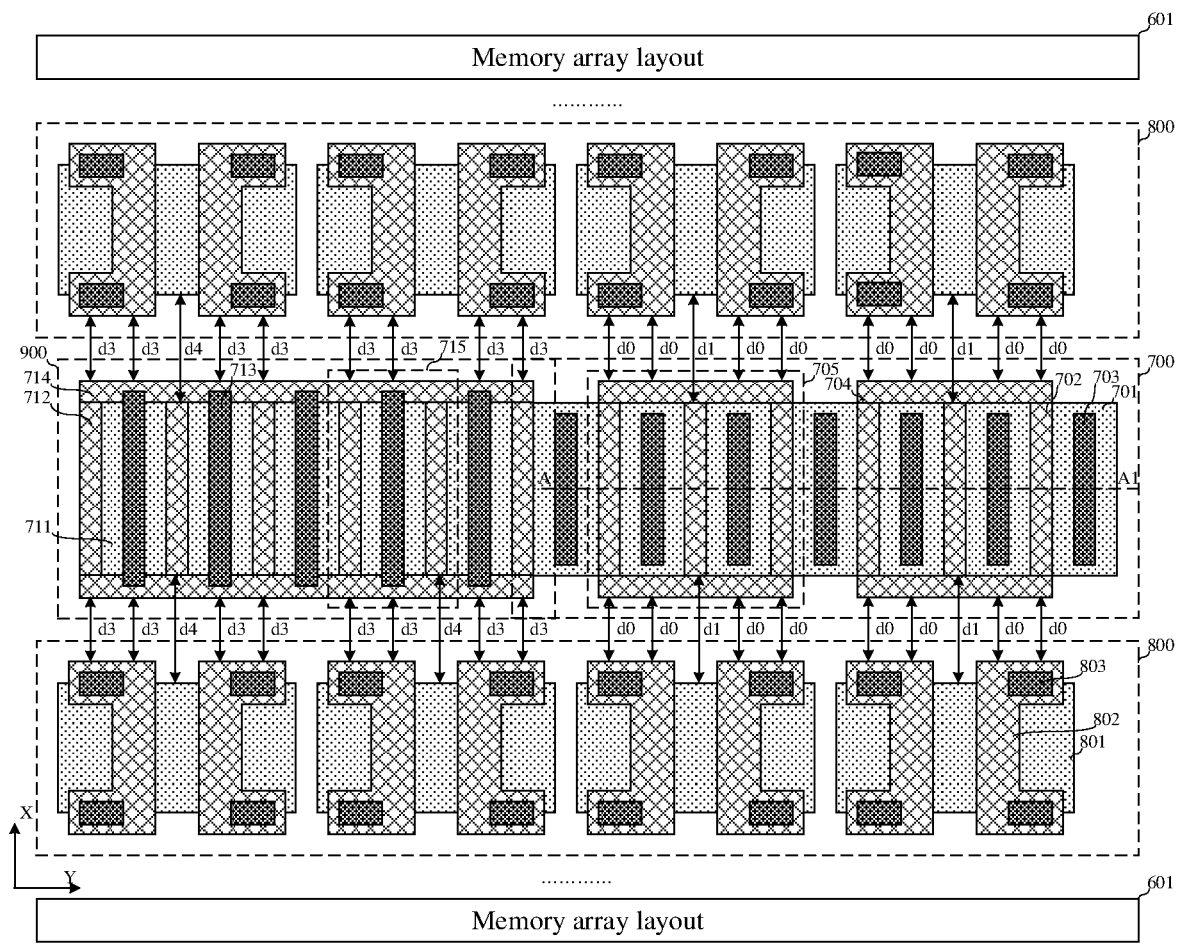
FIG. 8 is a schematic structural diagram of a memory layout according to another embodiment of the present application.
Figure 9:
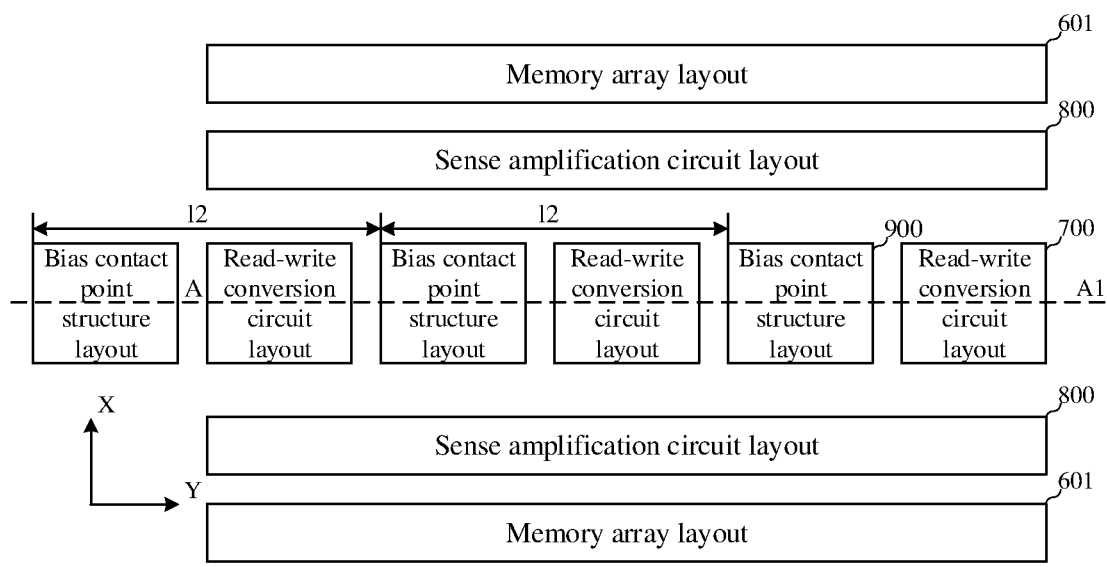
FIG. 9 is a schematic layout diagram of a memory layout according to another embodiment of the present application.

FIG. 8 is a schematic structural diagram of a memory layout according to this embodiment, and FIG. 9 is a schematic layout diagram of a memory layout according to this embodiment. The following details the memory layout according to the embodiment with reference to the accompanying drawings, specifically as follows:

Referring to FIG. 8, the memory layout includes:

Memory array layouts 601, extending in the second direction Y. The memory array layouts 601 are configured to form the memory arrays 101 (referring to FIG. 1).

Read-write conversion circuit layouts 700, disposed between two adjacent ones of the memory array layouts 601 in the first direction X. The read-write conversion circuit layouts 700 are arranged in the second direction Y, and have a symmetry axis AA1 in the second direction Y. The first direction X is perpendicular to the second direction Y. The read-write conversion circuit layouts 700 are configured to form the read-write conversion circuits 200 (referring to FIG. 1).

Sense amplification circuit layouts 800, symmetrically disposed between two adjacent ones of the memory array layouts 601 based on the symmetry axis AA1. Extension directions of gate patterns 802 in the sense amplification circuit layouts 800 are the same as extension directions of gate patterns 702 in the read-write conversion circuit layouts 700.

It should be noted that, the figure merely illustrates a part of the sense amplification circuit layouts 800, namely a part of MOS layouts adjacent to the read-write conversion circuit layouts 700. The person skilled in the art understands that the sense amplification circuit layouts 800 further include other structures, to allow the memory formed by the memory layout to function normally.

Bias contact point structure layouts 900, disposed in gaps between the read-write conversion circuit layouts 700, and configured to form the bias contact point structures 600 (referring to FIG. 2).

It should be noted that, in the second direction Y, this embodiment merely shows a schematic diagram of a bias contact point structure layout 900 and a read-write conversion circuit layout 700. In the second direction Y, a plurality of read-write conversion circuit layouts 700, bias contact point structure layouts 900, and sense amplification circuit layouts 800 correspondingly located on two sides of the read-write conversion circuit layouts 700 and the bias contact point structure layouts 900.

In the first direction X, the sense amplification circuit layouts 800 adjacent to the bias contact point structure layouts 900 are at an equal distance away from the read-write conversion circuit layouts 700 and the bias contact point structure layouts 900.

Referring to FIG. 9, in this embodiment, distances 12 between adjacent bias contact point structure layouts 900 are equal.

It should be noted that, FIG. 8 does not illustrate structures of equalization circuit layouts and input/output circuit layouts. It will be appreciated that, based on the foregoing embodiments, in an embodiment, the memory layout further includes: equalization circuit layouts, disposed between two adjacent ones of the memory array layouts 601 based on the symmetry axis AA1, and configured to form the equalization circuits 400 (referring to FIG. 1); and input/output circuit layouts, disposed between two adjacent ones of the memory array layouts 601 based on the symmetry axis AA1, and configured to form the input/output circuits 500 (referring to FIG. 1).

In some embodiments, the read-write conversion circuit layout 700 includes:

a first active pattern 701, disposed in a well region of a semiconductor substrate, extending in the second direction Y, and configured to form the first active area 202 (referring to FIG. 3).

Gate patterns 702, disposed on the first active pattern 701 at intervals, and extending in the first direction X, extension directions of which are the same as extension directions of the gate patterns 802 of the MOS transistors in the sense amplification circuit layouts 800, and configured to form the gate structures 203 (referring to FIG. 3).

Gate extension patterns 704, disposed on edges of the gate patterns 702 on the first active pattern 701, and extending in the second direction. The gate extension patterns 704 and the gate patterns 702 form first closed rings 705. In the first direction X, distances between the gate patterns 802 in the sense amplification circuit layouts 800 adjacent to the gate extension patterns 704 and the gate extension patterns 704 are equal.

Conductive contact patterns 703, disposed on the first active pattern 701 in gaps between two adjacent ones of the gate patterns 702, and configured to form the conductive contact structures 205 (referring to FIG. 3).

In this embodiment, the conductive contact patterns 703 and the gate extension patterns 704 are arranged to be insulated from each other.

In an example, referring to FIG. 7, the conductive contact patterns 703 extend in the first direction X, and are in no contact with the closed rings 705. By separately arranging the conductive contact patterns 703 and the closed rings 705, the conductive contact patterns 703 and the gate extension patterns 704 are insulated from each other.

In another example, the read-write conversion circuit layout further includes, isolation patterns, disposed on inner sidewalls of the closed rings. The conductive contact patterns fill remaining voids of the closed rings, so that the conductive contact patterns 703 and the gate extension patterns 704 are insulated from each other by the isolation patterns.

The bias contact point structure layout 900 includes:

A doping pattern, disposed in the well region, and configured to form the doping region 220 (referring to FIG. 4).

A second active pattern 711, disposed in the doped pattern, extending in the second direction Y, and configured to form the second active area 212 (referring to FIG. 4).

An isolation pattern (not shown), disposed on an edge of the second active pattern 711 in a surrounding way, and configured to form the isolation region 230 (referring to FIG. 5).

First equalization patterns 712, disposed on the second active pattern 711 at intervals, lengths of the first equalization patterns 717 in the second direction Y being smaller than lengths of the first equalization patterns 712 in the first direction X, and configured to form the first equalization structures 213 (referring to FIG. 4).

Second equalization patterns 714, disposed on the second active pattern 711 and the isolation pattern (not shown), extending in the second direction Y, located at edges of the first equalization patterns 712, and configured to form the second equalization structures 214 (referring to FIG. 4). The second equalization patterns 714 and the first equalization patterns 712 form second closed rings 715. In the first direction, lengths of outer sides of the first closed rings 705 are the same as lengths of outer sides of the second closed rings 715.

In an example, lengths of the second equalization patterns 714 in the first direction X are the same as lengths of the first equalization patterns 712 in the second direction Y.

Bias contact patterns 713, disposed on the second active pattern 711 in the gaps between two adjacent ones of the first equalization patterns 712.

In an example, in the first direction, lengths of the bias contact patterns 713 are greater than lengths of the first equalization patterns 712. In addition, the bias contact patterns 713 are also located on top surfaces of the second equalization patterns 714, and are in connect with the second equalization patterns.

For the read-write conversion circuit layouts 700, in the first direction, the distances between the active patterns 801 in the sense amplification circuit layouts 800 adjacent to the read-write conversion circuit layouts 700 and the first active pattern 701 are equal.

In some embodiments, the first active pattern 701 has a distance of d1 to the active pattern 801 in the sense amplification circuit layout 800 on either side, and any edge position of the first active pattern 701 has an equal distance to the active pattern 801 in the sense amplification circuit layout 800 on either side. The gate extension patterns 704 have distances of d0 to the gate patterns 702 in the sense amplification circuit layouts 800 on two sides, and any edge position of the gate extension patterns 704 has an equal distance to the gate patterns 702 in the sense amplification circuit layouts 800 on two sides. This ensures that the environments of the gate patterns 702 of the different MOS transistors in the sense amplification circuit layouts 800 on both sides of the read-write conversion circuit layouts 700.

In addition, spacings between adjacent gate patterns 702 that are disposed at intervals are equal.

Further, the distances d1 between the active patterns 801 in the sense amplification circuit layouts 800 adjacent to the bias contact point structure layouts 900 and the first active pattern 701 are equal to the distances d4 between the active patterns 801 in the sense amplification circuit layouts 800 adjacent to the bias contact point structure layouts 900 and the second active pattern 711, i.e., d1=d4. By ensuring that the distances d4 between the active patterns 801 in the adjacent sense amplification circuit layouts 800 and the second active pattern 711 are equal to the distances d1 between the active patterns 801 in the adjacent sense amplification circuit layouts 800 and the first active pattern 701, it is ensured that the bias contact point structure layouts 900 disposed in the gaps between the read-write conversion circuit layouts 700 do not change the environments of the active patterns in the sense amplification circuit layouts 800.

The second equalization patterns 714 have distances of d3 to the gate patterns 802 in the sense amplification circuit layouts 800 on two sides. In addition, any edge position of the second equalization patterns 714 has an equal distance to the gate patterns 802 in the sense amplification circuit layouts 800 on two sides, to ensure that the environments of the gate patterns 802 of the different MOS transistors in the sense amplification circuit layouts 800 on two sides of the read-write conversion circuit layouts 700 are consistent. In addition, intervals between adjacent gate patterns 702 that are disposed at intervals are equal.

For the bias contact point structure layouts 900, in the first direction X, the active patterns 801 in the sense amplification circuit layouts 800 adjacent to the bias contact point structure layouts 900 and the second active pattern 711 are equal.

In some embodiments, the second active pattern 711 has a distance of d4 to the active pattern 801 in the sense amplification circuit layout 800 on either side. In addition, any edge position of the second active pattern 711 has an equal distance to the active pattern 801 in the sense amplification circuit layout 800 on either side.

Further, the distances d1 between the active patterns 801 in the sense amplification circuit layouts 800 adjacent to the bias contact point structure layouts 900 and the first active pattern 701 are equal to the distances d4 between the active patterns 801 in the sense amplification circuit layouts 800 adjacent to the bias contact point structure layouts 900 and the second active pattern 711, i.e., d1=d4. By ensuring that the distances d4 between the active patterns 801 in the adjacent sense amplification circuit layouts 800 and the second active pattern 711 are equal to the distances d1 between the active patterns 801 in the adjacent sense amplification circuit layouts 800 and the first active pattern 701, it is ensured that the bias contact point structure layouts 900 disposed in the gaps between the read-write conversion circuit layouts 700 do not change the environments of the active patterns in the sense amplification circuit layouts 800.

The second equalization patterns 714 have distances of d3 to the gate patterns 802 in the sense amplification circuit layouts 800 on two sides. In addition, any edge position of the second equalization patterns 714 has an equal distance to the gate patterns 802 in the sense amplification circuit layouts 800 on two sides, to ensure that the environments of the gate patterns 802 of the different MOS transistors in the sense amplification circuit layouts 800 on two sides of the read-write conversion circuit layouts 700 are consistent. In addition, spacings between adjacent first equalization patterns 712 that are disposed at intervals are equal.

Further, the distances d0 between the gate patterns 802 in the sense amplification circuit layouts 800 adjacent to the bias contact point structure layouts 900 and the gate extension patterns 704 are equal to the distances d3 between the gate patterns 802 in the sense amplification circuit layouts 800 adjacent to the bias contact point structure layouts 900 and the second equalization patterns 714, namely d0=d3. By ensuring that the distances between the gate patterns 802 in the adjacent sense amplification circuit layouts 800 and the gate extension patterns 704 are equal to the distances between the gate patterns 802 in the adjacent sense amplification circuit layouts 800 and the second equalization patterns 714, it is ensured that the bias contact point structure layouts 900 disposed in the gaps between the read-write conversion circuit layouts 700 do not change the environments of the gate patterns 802 in the sense amplification circuit layouts 800.

Further, the distances d0 between the gate patterns 802 in the sense amplification circuit layouts 800 adjacent to the bias contact point structure layouts 900 and the gate extension patterns 704 are equal to the distances d3 between the gate patterns 802 in the sense amplification circuit layouts 800 adjacent to the bias contact point structure layouts 900 and the second equalization patterns 714, namely d0=d3. By ensuring that the distances between the gate patterns 802 in the adjacent sense amplification circuit layouts 800 and the gate extension patterns 704 are equal to the distances between the gate patterns 802 in the adjacent sense amplification circuit layouts 800 and the second equalization patterns 714, it is ensured that the bias contact point structure layouts 900 disposed in the gaps between the read-write conversion circuit layouts 700 do not change the environments of the gate patterns 802 in the sense amplification circuit layouts 800 on two sides.

In some embodiments, the sense amplification circuit layout 800 includes: a first NMOS region layout, a second NMOS region layout, a first PMOS region layout, and a second PMOS region layout. It should be noted that, FIG. 9 does not illustrate the first NMOS region layout, the second NMOS region layout, the first PMOS region layout, the second PMOS region layout. The person skilled in the art may refer to the layout diagram as shown in FIG. 7. The first NMOS region layout and the second PMOS region layout are disposed between two adjacent ones of the memory array layouts 601 based on the symmetry axis AA1. The first PMOS region layout and the second PMOS region layout are disposed between two adjacent ones of the memory array layouts 601 based on the symmetry axis AA1. The first NMOS region layout is configured to form the circuit of the first NMOS region 310 (referring to FIG. 7), the second NMOS region layout is configured to form the circuit of the second NMOS region 320 (referring to FIG. 7), the first PMOS region layout is configured to form the circuit of the first PMOS region 301 (referring to FIG. 7), and the second PMOS region layout is configured to form the circuit of the second PMOS region 302 (referring to FIG. 7), so as to form the memory structure as shown in FIG. 7 by the corresponding layout manner of the memory.

Compared with the related art, by ensuring that the active patterns in the adjacent sense amplification circuit layouts are at an equal distance away from the first active pattern and the second active pattern, it is ensured that the bias contact point structure layouts disposed in the gaps between read-write conversion circuit layouts do not change the environments of the active patterns in the different sense amplification circuit layouts on both sides. By ensuring that the gate patterns in the adjacent sense amplification circuit layouts are at an equal distance away from the gate extension patterns and the second equalization patterns, it is ensured that the bias contact point structure layouts disposed in the gaps between read-write conversion circuit layouts do not change the environments of the active patterns in the different sense amplification circuit layouts on both sides.

Since the first embodiment corresponds to this embodiment, this embodiment may be implemented in cooperation with the first embodiment. The related technical details mentioned in the first embodiment are still valid in this embodiment, and the technical effects that may be achieved in the first embodiment may also be achieved in this embodiment, which will not be repeated here. Correspondingly, the related technical details mentioned in this embodiment may also be applied to the first embodiment.

Those of ordinary skill in the art should understand that the above embodiments are specific embodiments for implementing the present application. In practical applications, various changes may be made to the above embodiments in terms of form and details without departing from the spirit and scope of the present application.

The invention claimed is:

1. A memory structure, comprising:
   memory arrays, each of the memory arrays comprising a plurality of memory cells;
   read-write conversion circuits, each of the read-write conversion circuits disposed between two adjacent ones of the memory arrays in a first direction; the read-write conversion circuits being arranged in a second direction, having a symmetry axis in the second direction, configured to write external data into the memory cells, or read data from the memory cells; and the first direction being perpendicular to the second direction;
   sense amplification circuits, symmetrically disposed between two adjacent ones of the memory arrays based on the symmetry axis, coupled to the memory cells in the adjacent ones of the memory arrays, and configured to sense voltages of the memory cells and output logic 1 or 0 corresponding to the voltages of the memory cells; and
   bias contact point structures, disposed in gaps between the read-write conversion circuits, and configured to set a bias voltage of a well region where the bias contact point structures are located;
   wherein in the first direction, the sense amplification circuits adjacent to the bias contact point structures are at an equal distance away from the read-write conversion circuits and the bias contact point structures.

2. The memory structure according to claim 1, wherein in the second direction, distances between every two adjacent ones of the bias contact point structures are equal.

3. The memory structure according to claim 1, wherein each of metal-oxide-silicon transistors in the read-write conversion circuits comprises:
   a first active area, disposed in a well region of a semiconductor substrate, and extending in the second direction;
   gate structures, disposed on the first active area at intervals, and extending in the first direction, extension directions of the gate structures of the metal-oxide-silicon transistors in the read-write conversion circuits being the same as extension directions of gate structures of metal-oxide-silicon transistors in the sense amplification circuits;
   gate extension structures, disposed on edges of the gate structures on the first active area, extending in the second direction, and forming ring-shaped gate structures together with the gate structures;
wherein in the first direction, distances between the gate structures of the metal-oxide-silicon transistors in the sense amplification circuits adjacent to the gate extension structures and the gate extension structures are equal; and
conductive contact structures, disposed on the first active area in gaps between two adjacent ones of the gate structures, and heights of top surfaces of the conductive contact structures being higher than heights of top surfaces of the gate structures.

4. The memory structure according to claim 3, wherein each of the bias contact point structures comprises:
a doping region, disposed in the well region, an ion type doped in the doping region being the same as an ion type doped in the well region, and an ion concentration doped in the doping region being greater than an ion concentration doped in the well region;
a second active area, disposed in the doping region;
an isolation region, disposed on an edge of the second active area in a surrounding way;
first equalization structures, disposed on the second active area at intervals, and lengths of the first equalization structures in the second direction being smaller than lengths of the first equalization structures in the first direction;
second equalization structures, disposed on the second active area and the isolation region, extending in the second direction, located at edges of the first equalization structures, and forming ring-shaped equalization structures together with the first equalization structures;
wherein in the first direction, lengths of outer sides of the ring-shaped equalization structures are the same as lengths of outer sides of the ring-shaped gate structures; and
bias contact structures, disposed on the second active area in gaps between two adjacent ones of the first equalization structures, heights of top surfaces of the bias contact structures being higher than heights of top surfaces of the first equalization structures.

5. The memory structure according to claim 4, wherein active areas in the sense amplification circuits adjacent to the bias contact point structures are at an equal distance away from the first active area and the second active area; and
gate structures in the sense amplification circuits adjacent to the bias contact point structures are at an equal distance away from the gate extension structures and the second equalization structures.

6. The memory structure according to claim 4, wherein spacings between every two adjacent ones of the first equalization structures that are disposed at intervals are equal.

7. The memory structure according to claim 4, wherein lengths of the second equalization structures in the first direction are the same as lengths of the first equalization structures in the second direction.

8. The memory structure according to claim 4, wherein a material of the first equalization structures is the same as a material of the second equalization structures, heights of top surfaces of the first equalization structures are consistent with heights of top surfaces of the second equalization structures, and thicknesses of the first equalization structures are consistent with thicknesses of the second equalization structures.

9. The memory structure according to claim 4, wherein the first equalization structures, the second equalization structures and the gate structures are made of a same material.

10. The memory structure according to claim 4, wherein the bias contact structures fill the ring-shaped equalization structures.

11. The memory structure according to claim 4, wherein in the first direction, lengths of the bias contact structures are greater than lengths of the first equalization structures, and the bias contact structures are partially located on top surfaces of the second equalization structures, and are in contact with the second equalization structures.

12. The memory structure according to claim 4, wherein a material of the bias contact structures is the same as a material of the conductive contact structures.

13. The memory structure according to claim 1, wherein each of the sense amplification circuits comprises:
a circuit of a first N-channel metal-oxide semiconductor region, coupled to the memory cells in the adjacent one of the memory arrays;
a circuit of a second N-channel metal-oxide semiconductor region, coupled to the memory cells in the adjacent one of the memory arrays;
a circuit of a first P-channel metal-oxide semiconductor region, coupled to the memory cells in the adjacent one of the memory arrays; and
a circuit of a second P-channel metal-oxide semiconductor region, coupled to the memory cells in the adjacent one of the memory arrays.

14. The memory structure according to claim 1, further comprising:
equalization circuits, symmetrically disposed between two adjacent ones of the memory arrays based on the symmetry axis, electrically connected to the sense amplification circuits, and configured to equalize voltages of lines; wherein each of the lines is between a sense amplification circuit and a the memory cell coupled to the sense amplification circuit; and
input/output circuits, symmetrically disposed between two adjacent ones of the memory arrays based on the symmetry axis, electrically connected to the memory cells in the adjacent ones of the memory arrays, and configured to select the memory cells in the memory arrays.

15. A memory layout, comprising:
memory array layouts;
read-write conversion circuit layouts, each of the read-write conversion circuit layouts disposed between two adjacent ones of the memory array layouts in a first direction; the read-write conversion circuit layouts being arranged in a second direction, having a symmetry axis in the second direction; and the first direction being perpendicular to the second direction;
sense amplification circuit layouts, symmetrically disposed between two adjacent ones of the memory array layouts based on the symmetry axis; and
bias contact point structure layouts, disposed in gaps between the read-write conversion circuit layouts;
wherein in the first direction, the sense amplification circuit layouts adjacent to the bias contact point structure layouts are at an equal distance away from the read-write conversion circuit layouts and the bias contact point structure layouts.

16. The memory layout according to claim 15, wherein in the second direction, distances between every two adjacent ones of the bias contact point structure layouts are equal.

17. The memory layout according to claim 15, wherein each of the read-write conversion circuit layouts comprises:
- a first active pattern, disposed in a well region of a semiconductor substrate, and extending in the second direction;
- gate patterns, disposed on the first active pattern at intervals, and extending in the first direction, extension directions of the gate patterns in the read-write conversion circuit layouts being the same as extension directions of gate patterns of metal-oxide-silicon transistors in the sense amplification circuit layouts;
- gate extension patterns, disposed on edges of the gate patterns on the first active pattern, extending in the second direction, and forming first closed rings together with the gate patterns;
- wherein in the first direction, distances between the gate patterns of the metal-oxide-silicon transistors in the sense amplification circuit layouts adjacent to the gate extension patterns and the gate extension patterns are equal; and
- conductive contact patterns, disposed on the first active pattern in gaps between two adjacent ones of the gate patterns.

18. The memory layout according to claim 17, wherein each of the bias contact point structure layouts comprises:
- a doping pattern, disposed in the well region;
- a second active pattern, disposed in the doped pattern, and extending in the second direction;
- an isolation pattern, disposed on an edge of the second active pattern in a surrounding way;
- first equalization patterns, disposed on the second active pattern at intervals, and lengths of the first equalization patterns in the second direction being smaller than lengths of the first equalization patterns in the first direction;
- second equalization patterns, disposed on the second active pattern and the isolation pattern, extending in the second direction, located at edges of the first equalization patterns, and forming second closed rings together with the first equalization patterns;
- wherein in the first direction, lengths of outer sides of the first closed rings are the same as lengths of outer sides of the second closed rings; and
- bias contact patterns, disposed on the second active pattern in gaps between two adjacent ones of the first equalization patterns.

19. The memory layout according to claim 18, wherein
- active patterns in the sense amplification circuit layouts adjacent to the bias contact point structure layouts are at an equal distance away from the first active pattern and the second active pattern; and
- gate patterns in the sense amplification circuit layouts adjacent to the bias contact point structure layouts are at an equal distance away from the gate extension patterns and the second equalization patterns.

20. The memory layout according to claim 18, wherein spacings between every two adjacent ones of the first equalization patterns that are disposed at intervals are equal.

21. The memory layout according to claim 18, wherein lengths of the second equalization patterns in the first direction are the same as lengths of the first equalization patterns in the second direction.

22. The memory layout according to claim 18, wherein in the first direction, lengths of the bias contact patterns are greater than lengths of the first equalization patterns, the bias contact patterns are partially located on top surfaces of the second equalization patterns, and are in contact with the second equalization patterns.

23. The memory layout according to claim 15, wherein each of the sense amplification circuit layouts comprises: a first N-channel metal-oxide semiconductor region layout, a second N-channel metal-oxide semiconductor region layout, a first P-channel metal-oxide semiconductor region layout, and a second P-channel metal-oxide semiconductor region layout.

24. The memory layout according to claim 15, further comprising:
- equalization circuit layouts, symmetrically disposed between two adjacent ones of the memory array layouts based on the symmetry axis; and
- input/output circuit layouts, symmetrically disposed between two adjacent ones of the memory array layouts based on the symmetry axis.

* * * * *